United States Patent [19]

Vasile

[11] Patent Number: 5,089,791
[45] Date of Patent: Feb. 18, 1992

[54] MMIC-COMPATIBLE POWER AMPLIFIER
[75] Inventor: Carmine F. Vasile, Medford, N.Y.
[73] Assignee: Grumman Aerospace Corporation, Bethpage, N.Y.
[21] Appl. No.: 620,214
[22] Filed: Nov. 30, 1990
[51] Int. Cl.[5] ............................................. H03F 3/68
[52] U.S. Cl. .................................... 330/295; 330/277; 330/306; 330/311
[58] Field of Search ............... 330/126, 277, 295, 302, 330/306, 307, 311

[56] References Cited

U.S. PATENT DOCUMENTS

| | | | |
|---|---|---|---|
| 4,187,471 | 2/1980 | Shimoji et al. | 330/295 X |
| 4,914,728 | 4/1990 | Fullerton | 330/126 X |

Primary Examiner—James B. Mullins
Attorney, Agent, or Firm—Pollock, VandeSande & Priddy

[57] ABSTRACT

The parasitic capacitance which is inherent in an amplifier stage fabricated by MMIC or MIC technology oftentimes is cumbersome and of little use. The present invention utilizes this parasitic capacitance for effecting a quadrature circuit, fabricated onto the same substrate as the amplifiers for matching and biasing the amplifiers, thereby providing for broadband operation. When a pair of amplifiers are driven in quadrature, there results a low Q, low inductance circuit which has enhanced efficiency and operates at a decreased temperature.

19 Claims, 2 Drawing Sheets

MMIC-COMPATIBLE POWER AMPLIFIER

FIELD OF THE INVENTION

The present invention relates to amplifiers, and more particularly to power amplifiers which may be fabricated by microwave monolithic integrated circuit (MMIC) and microwave integrated circuit (MIC) technologies.

BACKGROUND OF THE INVENTION

The conventional way of getting higher power from standard field effect transistors (FET) is to fabricate a larger device and directly connecting in parallel a number of FETs so that when the load is varied, all of the FETs may become efficient and dissipate less (or more) power together. However, when there is a low impedance load, a worse case scenario occurs because a large amount of current is drawn by the device, and yet not all of the power is dissipated by the same. Consequently, the device gets very hot and its useful life is thereby shortened.

For low feedback power amplifiers fabricated by means of MMIC or MIC technologies, it is extremely difficult to obtain high inductance values on the same substrate, since the manufacturing process allows only the fabrication of pancake coils on the same substrate. In other words, no iron core can be fabricated on the same chip. In addition, there is only limited real estate available on the chip.

For effecting broadband amplifiers, oftentimes quadrature-hybrid circuits, one provided at the input and one provided at the output of the amplifiers, are used. These quadrature-hybrid circuits are well known and, as in the case of being used as a part of broadband amplifier circuit, are often quite complicated and consist of many different components. Such a circuit, therefore, is unwieldy and cannot be readily adapted to be used in dimension dependant devices such as spatial radars.

BRIEF DESCRIPTION OF THE PRESENT INVENTION

Recognizing that there is inherent parasitic capacitance in the amplifiers fabricated by MMIC or MIC technology, for the present invention, simple coils and capacitors are fabricated onto the same substrate as the amplifiers for effectively driving the amplifiers in quadrature, biasing the amplifiers and, at the same time, tuning the parasitic capacitance. By means of the same quadrature circuit, the required phase shift and current gain are provided. Furthermore, by driving the pair of amplifiers in the amplifier stage with a quadrature circuit, an impedance inversion which causes one of the amplifiers to have a high load impedance and the other of the amplifiers to have a low impedance load results. This in turn causes the power dissipation to be averaged out, thereby lowering the temperature of the amplifiers and therefore that of the chip.

As a consequence, a power amplifying stage which requires only a relatively small portion of real estate on a chip and which can readily be fabricated is obtained. Additional matching circuits, which can easily be fabricated on the same substrate, can be provided at both the input and output of the power amplifying stage to provide for a broadband amplifier.

It is, therefore, an objective of the present invention to provide for a MMIC-compatible power amplifier circuit that has minimal load pull and enhanced efficiency.

BRIEF DESCRIPTION OF THE FIGURES

The above-mentioned objective and advantages of the present invention will become more apparent and the invention itself will be best understood by reference to the following description of an embodiment of the invention taken in conjunction with the accompanying drawings, wherein.

DETAILED DESCRIPTION OF THE PRESENT INVENTION

Figure 1:
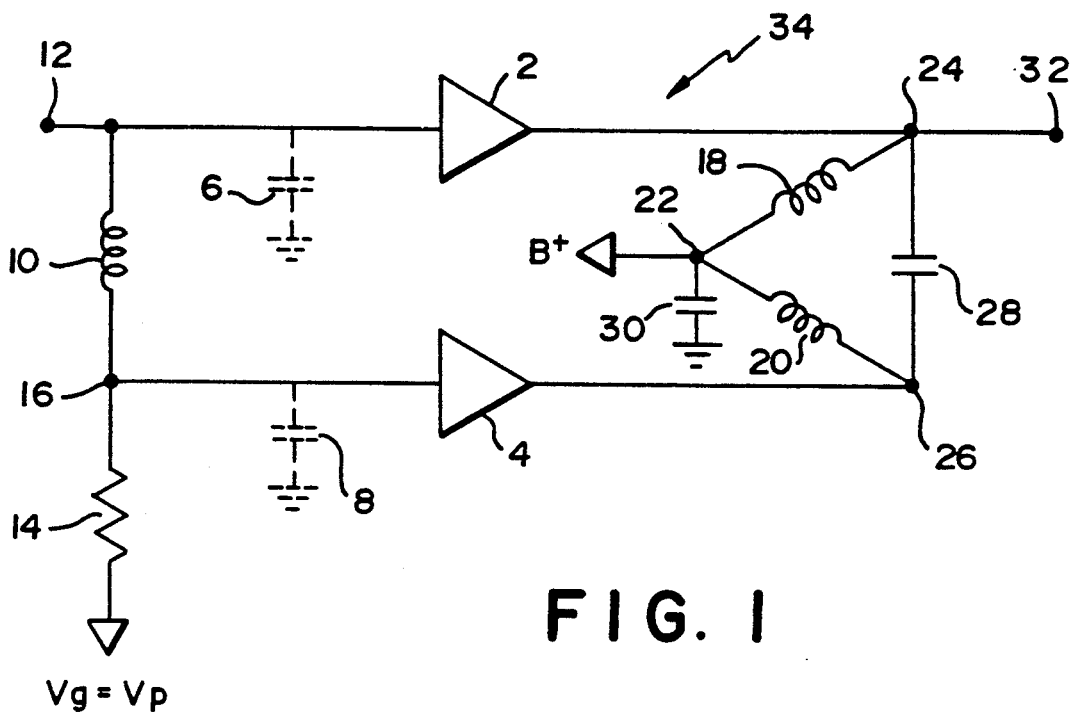
FIG. 1 is a schematic of an embodiment of the present invention.

With reference to FIG. 1, there is shown a pair amplifiers 2 and 4 which, for this application, is assumed to be low feedback amplifiers. If amplifiers 2 and 4, were fabricated by means of MMIC technology on a substrate, it is well known that such fabrication produces parasitic capacitance such as those shown by the dotted lines and designated as 6 and 8. See *Microwave Field—Effect Transistors—Theory, Design and Application*, by Raymond S. Pengelly, Research Studies Press (1986), at pages 73 and 74.

Recognizing that such parasitic capacitance may be tuned by, for example, an inductance (which can readily be fabricated by MMIC technology onto the same substrate) and further recognizing that it might be advantageous to effect a quadrature circuit for simultaneously tuning, biasing and driving amplifiers 2 and 4 in quadrature, the inventor has fabricated onto the same substrate of amplifiers 2 and 4 an inductance coil 10. By connecting coil 10 across the respective inputs of amplifiers 2 and 4, ensuring in the meantime that parasitic capacitors 6 and 8 are tuned thereby, a 90 degree phase shift of any signal input at node 12 is effected and fed to amplifier 4. By means of resistor 14, which is connected to node 16 and a power supply means $V_g$, biasing is provided to amplifiers 2 and 4.

At the respective outputs of amplifiers 2 and 4, there is connected a lead network which comprises bias coils (chokes) 18 and 20, commonly connected at node 22. Connected across the remaining ends of respective coils 18 and 20, at nodes 24 and 26, is a capacitor 28. A power supply designated B+ is connected to the lead network at node 22. Also connected to node 22 is a filter capacitor 30. Coils 18 and 20 in the lead network perform double duty—supplying the current and phase shifting the signal provided by the amplifiers for outputting at node 32.

By utilizing the combination lag-lead circuit illustrated in FIG. 1, not only are the amplifiers being biased and driven in quadrature, the quadrature circuit can also be fabricated, at less real estate, in the same chip as the amplifiers using MMIC or MIC technology. Because of the quadrature circuit, the load pulling efficiency of the power amplifier stage, designated as 34, is enhanced. This is due to the impedance inversion occurring in amplifiers 2 and 4, which results from being driven in quadrature.

Putting it differently, the transistors (FETs) of one of the amplifiers, for example amplifier 2, may have a load impedance which is high; whereas amplifier 4 has an impedance that is low. As is well known, if a load impedance is varied, as for example when it goes from a low load to high load, the current drops, the voltage swing increases and the efficiency also increases. Consequently, the power (dc) dissipation goes down when there is a high impedance load. On the other hand, when there is a low impedance load, the opposite happens: that is, the current goes high, the voltage swing decreases, the efficiency decreases and the dc dissipation also decreases. By thus driving the amplifiers in quadrature, instead of connecting the same in parallel as was done in the prior art, the power dissipation is averaged out between amplifiers 2 and 4. In other words, while one amplifier may have a high impedance, the other amplifier has a low impedance. Thus, the temperature of the chip onto which the circuit of FIG. 1 is fabricated is averaged out between the amplifiers and becomes lower.

Although a lag-lead quadrature circuit is illustrated in FIG. 1, it should be appreciated that different quadrature circuits, such as a lag-lag and lead-lag, may also be fabricated. Such circuits may be comprised of shunt capacitance in series; inductance shunt capacitances; shunt inductance in series with capacitance shunt inductor; T inductance and capacitance or transmission line. In addition, although the lag circuit is shown to be provided at the inputs of the amplifiers while the lead circuit is provided at the outputs of the amplifiers, a quadrature circuit which is positioned and connected to the amplifiers at their inputs or outputs may also be effected. Furthermore, amplifiers 2 and 4 may be substituted for by low feedback amplifiers such as the cascode circuit shown in FIG. 2, or the diode modified cascode circuit described in co-pending application Ser. No. 485,495 entitled A Modified Cascode Circuit, filed on Feb. 27, 1990, by the same inventor of the instant invention, and incorporated herein by reference.

Figure 2:
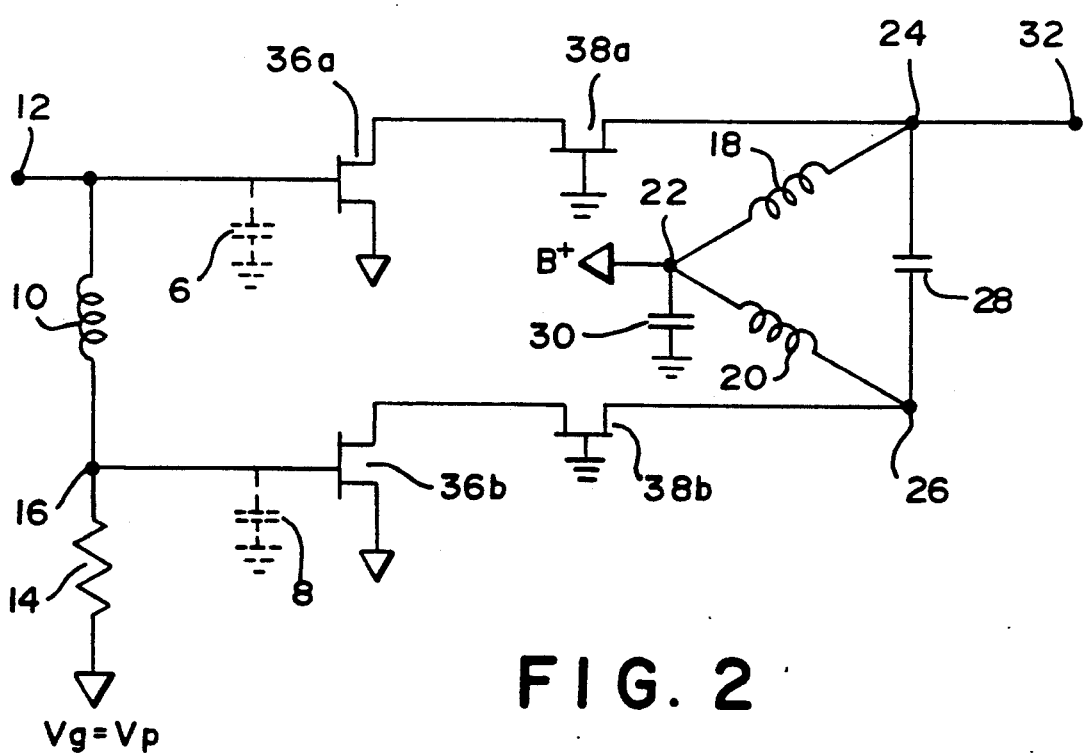
FIG. 2 is schematic of an amplifier circuit of the present invention which utilizes, instead of amplifiers, a cascode circuit.

A cascode circuit which utilizes a pair of FETs 36 and 38 are shown in FIG. 2. But for the use of the cascode circuit, the operation of the FIG. 2 power amplifier stage is the same as that of FIG. 1. Accordingly, the same components have been designated with the same numbers and no further discussion thereof is deemed necessary.

Figure 3:
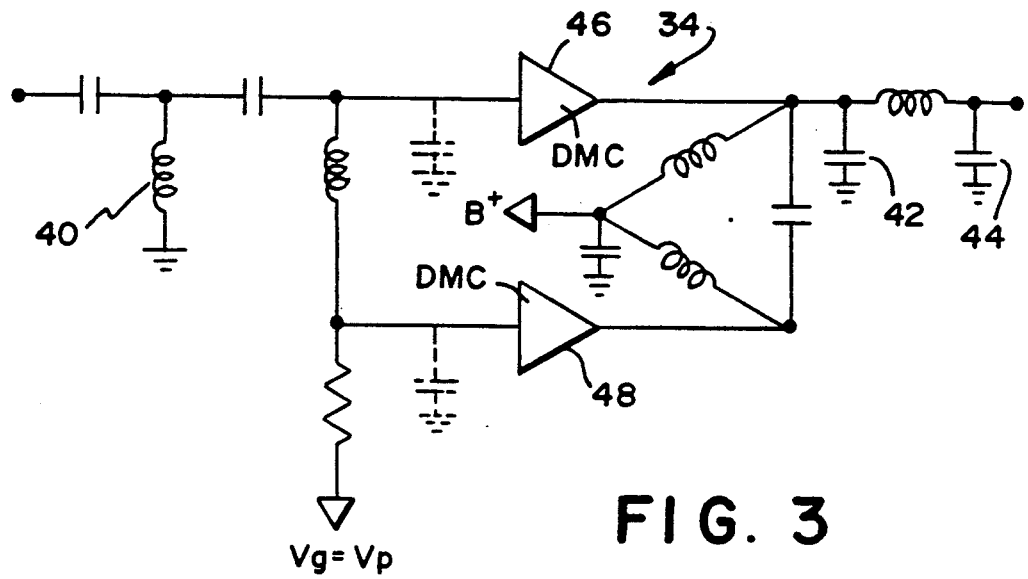
FIG. 3 is a schematic of the power amplifier stage of the present invention connected to additional matching circuits to provide for a broadband amplifier circuit.
Figure 4:
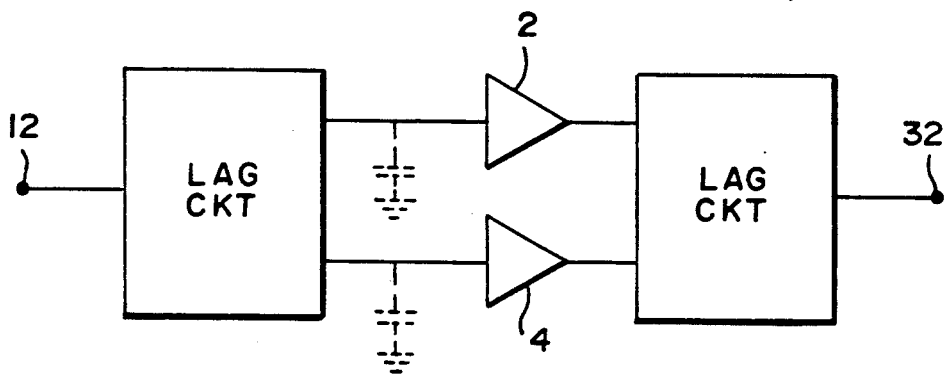
FIG. 4 is a simplified schematic of the amplifier of the instant invention with a Lag/Lag quadrature circuit.
Figure 5:
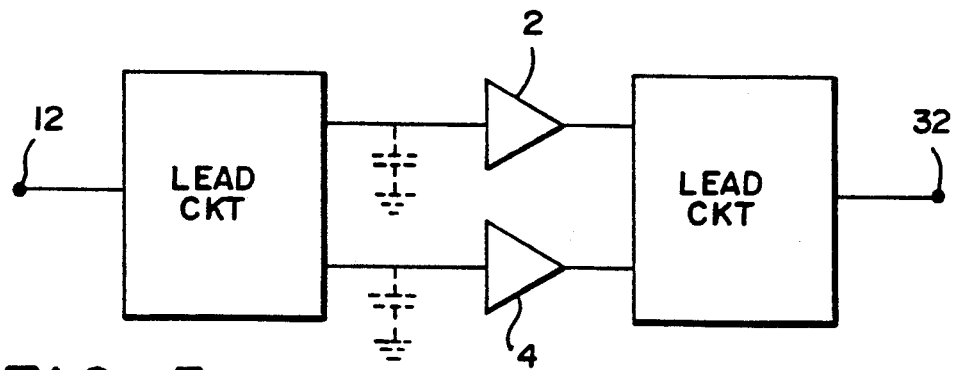
FIG. 5 is a simplified schematic of the amplifier of the instant invention with a Lead/Lead quadrature circuit.

With reference to FIG. 3, there is shown a power amplifier stage of the present invention connected to a number of matching circuits 40, 42, and 44, for effecting a broadband amplifier circuit. For the power amplifier stage of FIG. 3, the modified cascode circuits DMC 46 and 48 reference above are used.

Inasmuch as the present invention is subject to many variations, modifications and changes in detail, it is intended that all matter described throughout this specification and shown in the accompanying drawings be interpreted as illustrative and not in a limiting sense. Accordingly, it is intended that the invention be limited only by the spirit and scope of the appended claims.

I claim:

1. An amplifier circuit comprising:
   two low feedback amplifier means each having inherent parasitic capacitance;
   a quadrature circuit electrically connected to and cooperatively working with the two amplifier means for effecting, with the parasitic capacitances of the amplifier means, a high impedance load on one of the amplifier means and a low impedance load on the other amplifier means, thereby minimizing the load pull and enhancing the efficiency of the amplifier circuit.

2. The circuit of claim 1, wherein the amplifier means comprises cascode circuits.

3. The circuit of claim 1, wherein the amplifier means comprises modified cascode circuits.

4. The circuit of claim 1, wherein the quadrature circuit comprises a combination of lag and lead networks.

5. The circuit of claim 1, wherein the quadrature circuit comprises a combination of lag networks.

6. The circuit of claim 1, wherein the quadrature circuit comprises a combination of lead networks.

7. An amplifier circuit comprising:
   two low feedback amplifier means;
   a quadrature circuit having a combination of at least one lead and lag network electrically connected to and cooperatively working with the two amplifier means for effecting, with parasitic capacitance of the amplifier means, a high impedance load on one of the amplifier means and a low impedance load on the other amplifier means;
   wherein the lag network includes:
   an inductance means connected across respective inputs of the amplifier means; and
   a resistor having one end connected to a node common to the input of one of amplifier means, and another end connected to a power supply means.

8. An amplifier circuit comprising:
   two low feedback amplifier means;
   a quadrature circuit having a combination of at least one lead and lag network electrically connected to and cooperatively working with the two amplifier means for effecting, with parasitic capacitance of the amplifier means, a high impedance load on one of the amplifier means and a low impedance load on the other amplifier means;
   wherein the lead network includes:
   a pair of coils having respective first ends connected to a power supply means;
   a capacitor connected across the pair of coils at respective second ends thereof to form respective common nodes therewith;
   wherein each common node is connected to an output of one of the amplifier means, one of the common nodes being used as the output of the amplifier circuit.

9. An amplifier circuit comprising:
   at least two cascode circuits each having an input, output and inherent parasitic capacitance;
   a quadrature circuit electrically connected to the respective inputs and outputs of the cascode circuits and having at least one inductance means for effecting, with the parasitic capacitances of the cascode circuits, a high impedance load on one of the cascode circuits and a low impedance load on the other cascode circuit to minimize load pull and efficiency variation due to the load pull for the amplifier circuit.

10. The circuit of claim 9, wherein the cascode circuits are modified cascode circuits fabricated as part of a monolithic microwave integrated circuit; and wherein the quadrature circuit is also fabricated as part of the monolithic microwave integrated circuit.

11. The circuit of claim 9 wherein the quadrature circuit comprises a combination of lag and lead networks.

12. The circuit of claim 9 wherein the quadrature circuit comprises a combination of lag networks.

13. The circuit of claim 9 wherein the quadrature circuit comprises a combination of lead networks.

14. An amplifier circuit comprising:
at least two cascode circuits each having an input, output and inherent parasitic capacitance;
a quadrature circuit having at least one inductance means for effecting, with the parasitic capacitance, a high impedance load on one of the cascode circuits and a low impedance load on the other cascode circuit, the quadrature circuit including a combination of at least one lead and lag network;
wherein the lag network includes:
an inductance means connected across respective inputs of the amplifier means; and
a resistor having one end connected to a node common to the input of one of amplifier means, and another end connected to a power supply means.

15. An amplifier circuit comprising:
at least two cascode circuits each having an input, output and inherent parasitic capacitance;
a quadrature circuit having at least one inductance means for effecting, with the parasitic capacitance, a high impedance load on one of the cascode circuits and a low impedance load on the other cascode circuit, the quadrature circuit including a combination of at least one lead and lag network;
wherein the lead network includes:
a pair of coils having respective first ends connected to a power supply means;
a capacitor connected across the pair of coils at respective second ends thereof to form respective common nodes therewith;
wherein each common node is connected to an output of one of the amplifier means, one of the common nodes being used as the output of the amplifier circuit.

16. An amplifier stage fabricated as part of a microwave monolithic integrated circuit, comprising:
at least two amplifier means each including inherent parasitic capacitance;
at least one inductance means connected across the amplifier means for effecting, with the parasitic capacitance, a matching circuit for driving the amplifier stage in quadrature to effect an impedance inversion between the two amplifier means, and to thereby average and maximize the power dissipation between the two amplifier means and lower the temperature of the microwave monolithic integrated circuit.

17. The amplifier stage of claim 16, wherein the inductance means is part of a combination of lag and lead networks of a quadrature circuit.

18. The amplifier stage of claim 16, further comprising:
a resistor connecting the inductance means to a power supply means to provide biasing for the amplifier means.

19. The amplifier stage of claim 16, wherein the inductance means is part of a combination of lag networks of a quadrature circuit.

* * * * *